US009109122B2

(12) United States Patent
Tuffe et al.

(10) Patent No.: US 9,109,122 B2
(45) Date of Patent: Aug. 18, 2015

(54) EASY-CLEAN COOKING SURFACE AND CULINARY ARTICLE OR DOMESTIC ELECTRICAL APPLIANCE COMPRISING SUCH A COOKING SURFACE

(75) Inventors: Stephane Tuffe, Cognin (FR); Jean-Francois Pierson, Nancy Cedex (FR)

(73) Assignees: SEB S.A., Ecully (FR); UNIVERSITE DE LORRAINE, Nancy Cedex (FR); CENTRE NATIONAL DE LA RECEHERCHE SCIENTIFIQUE, Paris Cedex (FR)

( * ) Notice: Subject to any disclaimer, the term of this patent is extended or adjusted under 35 U.S.C. 154(b) by 240 days.

(21) Appl. No.: 13/576,705

(22) PCT Filed: Feb. 10, 2011

(86) PCT No.: PCT/FR2011/050278
§ 371 (c)(1),
(2), (4) Date: Nov. 15, 2012

(87) PCT Pub. No.: WO2011/098730
PCT Pub. Date: Aug. 18, 2011

(65) Prior Publication Data
US 2013/0136920 A1    May 30, 2013

(30) Foreign Application Priority Data

Feb. 12, 2010  (FR) ...................................... 10 00583

(51) Int. Cl.
*C09D 5/00* (2006.01)
*H05B 1/00* (2006.01)
*A47J 36/02* (2006.01)
(Continued)

(52) U.S. Cl.
CPC . *C09D 5/00* (2013.01); *A47J 36/02* (2013.01); *C23C 8/02* (2013.01); *C23C 12/00* (2013.01); *C23C 12/02* (2013.01); *C23C 14/0635* (2013.01); *C23C 14/0641* (2013.01); *C23C 14/0664* (2013.01); *H05B 1/00* (2013.01); *Y10T 428/265* (2015.01)

(58) Field of Classification Search
None
See application file for complete search history.

(56) References Cited

U.S. PATENT DOCUMENTS 6,197,438 B1 *  3/2001  Faulkner ....................... 428/627
8,070,010 B2    12/2011  Coudurier
(Continued)

FOREIGN PATENT DOCUMENTS

CN      101338411 A         1/2009
CN      101338411 A   *     1/2009
(Continued)

OTHER PUBLICATIONS

Pilloud et al. Materials Letters, 61, 2007 2506-2508.*
(Continued)

*Primary Examiner* — Vera Katz
(74) *Attorney, Agent, or Firm* — The Webb Law Firm

(57) ABSTRACT

Provided is a food-cooking surface for a culinary article or domestic electrical cooking appliance, consisting in depositing Zr and/or Nb and/or Ti on a substrate, the production process including a step of carburizing and/or nitriding at least one of the aforementioned elements, characterized in that the cooking surface also includes depositing Si so as to produce (Zr/Nb/Ti)—Si—(N/C) coatings. Also provided is a culinary article or domestic electrical or gas cooking appliance comprising such a cooking surface.

18 Claims, 3 Drawing Sheets

(51) Int. Cl.
  *C23C 8/02* (2006.01)
  *C23C 12/00* (2006.01)
  *C23C 12/02* (2006.01)
  *C23C 14/06* (2006.01)

(56) References Cited

U.S. PATENT DOCUMENTS

2008/0081211 A1  4/2008  Tuffe et al.
2009/0165656 A1  7/2009  Coudurier et al.

FOREIGN PATENT DOCUMENTS

| FR | 2848797 | A1 | 6/2004 |
| FR | 2883150 | A1 | 9/2006 |
| FR | 2897250 | A1 | 8/2007 |

OTHER PUBLICATIONS

Pilloud et al. Surface and Coating Technology. 180-181, 2004, 352-356.*
Pilloud et al. Materials Science and Engineering. B 131 2006, 36-39.*
Sandu, C.S. et al., "Formation of composite ternary nitride thin films by magnetron sputtering co-deposition", Surface & Coatings Technology 201 (2006), pp. 4083-4089, elsevier.com.
Pilloud, D. et al., "Structure and tribological properties of reactively sputtered Zr—Si—N. films", Thin Solid Films 496 (2006), pp. 445-449, elsevier.com.

* cited by examiner

EASY-CLEAN COOKING SURFACE AND CULINARY ARTICLE OR DOMESTIC ELECTRICAL APPLIANCE COMPRISING SUCH A COOKING SURFACE

BACKGROUND OF THE INVENTION

1. Field of the Invention

The present invention relates to the field of culinary articles and domestic electrical appliances for cooking food, and more particularly to the cooking surface of said culinary articles or domestic electrical appliances in contact with the food to be processed.

2. Brief Description of the Prior Art

The aim of the present invention is the improvement of cooking surfaces based on depositing Ti, Zr, Nb in the form of carbides, nitrides, or carbonitrides, in particular such as the ones described in patent applications FR 2848797, FR 2883150, and FR 2897250 filed in the name of the present applicant.

Such cooking surfaces have the property of being easy to clean after use as a food-cooking surface, wherein this ease in cleaning can be expressed as the possibility of easily removing carbonized food from the cooking surface.

Staining phenomena have at times been observed on such cooking surfaces upon contact with certain foods. These staining phenomena occur on deposits of diverse structures and compositions, without the surface preparation prior to said deposits affecting the appearance and/or the extent of these stains.

Analyses of this phenomenon indicate in particular that such stains essentially form during cooking with animal fats, either by the fats reacting with the surface and/or by oxidation of the surface.

The present invention aims to reduce the appearance of these stains considerably by increasing the resistance of such coatings to oxidation without impairing the properties of ease in cleaning specific to these surfaces.

SUMMARY OF THE INVENTION

The present invention is achieved with a food-cooking surface for a culinary article or domestic electrical cooking appliance consisting in depositing Zr and/or Nb and/or Ti on a substrate, the production process including a step of carburizing and/or nitriding of at least one of the elements such that the cooking surface also comprises a deposit of Si so as to produce (Zr/Nb/Ti)—Si—(N/C) coatings.

The term "(Zr/Nb/Ti)—Si—(N/C) coating" is understood to mean a Zr- and/or Nb- and/or Ti-based coating also comprising the element Si, a step of nitriding and/or carburizing taking place during or after the deposition of the aforementioned elements.

The present invention thus proposes improving the chemical inertness of prior art layers based on Zr and/or Nb and/or Ti in carbide, nitride, or carbonitride form used as cooking surfaces by the addition of silicon during the production process.

Various studies and analyses have in fact shown that the presence of silicon in the cooking surface greatly attenuates stains, or even results in them not forming at all, depending on the production conditions.

Furthermore, various tests have shown that the addition of silicon also makes it possible to increase the hardness, and thus the resistance to scratching, and improve the adhesion properties of the layers produced.

Surprisingly, the addition of silicon not only did not impair the property of these layers to be easily cleaned after use as a cooking surface, but even reinforced this property, thus considerably improving the various qualities of these layers beyond the goal originally sought.

According to a preferred method of production, the deposits are produced by physical vapor deposition, usually abbreviated PVD. Physical vapor deposition is a prior art process for depositing materials with the advantage of being able to use a small quantity of material and apply a thin layer of material on the substrate for producing the cooking surface, thus lowering the raw material cost of these materials. Furthermore, with this deposition technique it is possible to obtain depositions that adhere strongly to the substrate on which they are deposited. The risks of the deposit detaching during use are thus minimized. This aspect is important because the cooking surface must be able to withstand mechanical stresses induced by the use of forks, knives, and other kitchen implements during the handling of food in a cooking utensil such as a culinary article or a domestic electrical cooking appliance comprising said cooking surface.

The deposit is advantageously produced by reaction, i.e., in the presence of a reactive gas such as nitrogen, acetylene, methane, etc. so as to carry out the carburizing and/or nitriding step during the deposition step, thus cutting back on treatment time while increasing the hardness of the coatings.

Si is advantageously deposited in the same deposition step of depositing Zr and/or Nb and/or Ti, also in order to streamline costs and deposition time.

According to a preferred implementation of the invention, the cooking surface consists in depositing (Zr/Nb)—Si—N, owing to the superior resistance thereof to oxidation. Furthermore, deposits in the presence of nitrogen are more easily produced than deposits in the presence of acetylene or methane.

The content of Si is advantageously between 1 and 15 at. %, and preferably between 1 and 5 at. %. It turned out that a noticeable effect on the reduction of the appearance of stains on the cooking surfaces, as mentioned previously, is only evident for contents of Si greater than 1 at. %, which is also the minimum content that confers good scratch resistance to the coatings. Moreover, excessive Si contents induce changes in the structure of the layers obtained, which can impair the qualities obtained with lower Si levels.

According to a preferred method of embodiment, a metal deposition layer of one or more of the constituents Zr and/or Nb and/or Ti is produced prior to the carburizing and/or nitriding phase so as to strengthen the adhesion between the coating and the substrate.

Furthermore, depositing a metal layer is faster than depositing this same layer with a reactive gas, thus speeding up the overall deposition process.

The thickness of the deposit produced is between 2 and 10 µm so as to optimize treatment times and the cost of this coating.

When the physical vapor deposition technique is used, the physical spraying process is achieved by applying a voltage difference between a substrate and one or more targets obtained by assembly of one or more sheets or plates of material having the desired composition on a conductive surface, wherein said sheets or plates are obtained by lamination, powder sintering, thermal powder spraying, or casting. Generally any physical vapor deposition technique can be used, such as reactive cathode arc evaporation, for example.

The substrate can be composed of one or more metal sheets of the following materials: aluminum, copper, cast iron, steel, particularly stainless steel.

The present invention also relates to a culinary article for cooking food comprising a cooking surface as described above.

Specifically, such a culinary article can be a skillet, a saucepan, a Dutch oven, a wok, etc.

The present invention also relates to a domestic electrical appliance for cooking food comprising a cooking surface with electric or gas-powered means for heating said cooking surface, said cooking surface conforming to one of the features described above.

Specifically such a domestic electrical appliance can be a heating appliance for preparing food, a raclette grill, a fondue appliance, a fryer, a breadmaker, a rice cooker, etc.

BRIEF DESCRIPTION OF THE DRAWINGS

Other advantages resulting from the tests will emerge upon reading the following description, which refers to the appended figures, wherein.

DETAILED DESCRIPTION OF THE INVENTION

Figure 1:
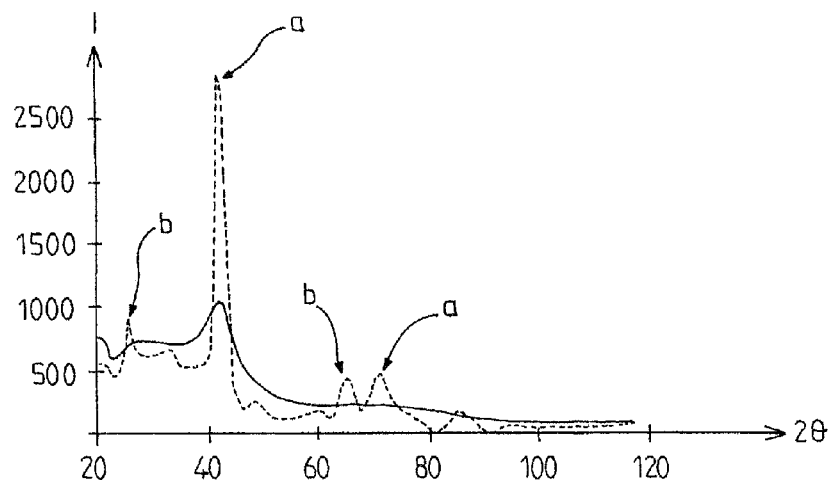
FIG. 1 is a grazing incidence X-ray diffractogram printout for two coatings, one of which is a coating according to the invention.

The first illustrative example of the present invention relates to depositing a NbN coating on a stainless steel substrate after degreasing and ionic etching of said substrate. The production method is a reactive vapor deposition wherein, after inducing an ultra-high vacuum in the chamber in which there is essentially only the argon necessary to produce the plasma, the spraying of the metal target is achieved by introducing nitrogen into the argon plasma so that the spraying of the metal target containing the niobium makes it possible to obtain niobium nitride (NbN).

Various production parameters can be changed so as to vary the speed of deposition (thickness of the coating) and the quality of the deposit, with the aim of obtaining layers sufficiently thick so as to have the desired features, but not excessively thick so as to maintain good adhesion to the substrate.

The use of a magnetron was chosen for increasing deposition speeds while enabling dense and pure coatings to be obtained by reducing the pressure in the chamber.

Moreover, the effect of the nitrogen flow rate, particularly on deposition speed and the crystalline structure of the coating, made it possible to find an optimum flow rate range for obtaining a deposition speed of around 1.5 µm/h to 4 µm/h.

One of the features of the layers is the thicknesses thereof, measured by means of a profilometer with which, after amplification, the movements of a stylus passing over the surface of the coating are transcribed on paper, a sudden deflection indicating that the stylus is in contact with the substrate. The thickness of the coating can be measured by measuring this deflection, either by calibration or with charts. Similar results can be obtained with a non-contact profilometer. This measurement is complemented by SEM (scanning electron microscopy) cross-section analysis. Lastly, the thickness of the coating can be measured by any other method enabling the precise measurement of the thickness of micrometric coatings, such as the "Calotest"® method or by examining a slice or fracture of the coating by light microscopy.

Another measurement relates to the chemical analysis of the coating, which is achieved by using a Castaing microprobe or by energy dispersive X-ray spectrometry in conjunction with a scanning electron microscope, wherein observing the de-excitation of electrons from the coating after electronic bombardment indicates the nature of the excited electron, or by Bragg-Brentano configuration x-ray diffraction for identifying the various crystalline phases of the layer.

The mechanical properties, and in particular resistance to scratching, are determined by a device commonly known as a "micro-scratch tester", which consists in movably applying a diamond stylus with a radius of curvature typically in the range of a few micrometers to several tens of micrometers to the surface of the coating under progressive loading from 0.1 to 5N. Various sensors with which the apparatus is equipped enable the penetration depth and the coefficient of friction to be determined.

According to the invention, a silicon target is introduced into the processing reactor. Different deposits were produced by maintaining the optimized parameters for the aforementioned NbN deposition. Only the intensity on the silicon target was adjusted so as to modify the Si content of the various different coatings.

This Si content of the different coatings is measured by the same techniques as mentioned previously.

Assuming that the compound NbN is stoichiometric, the Si/Nb ratio can be used to determine the atomic concentration of Si and therefore possibly the mass concentration of Si once the compounds present have been determined.

The analyses of the different coatings obtained show that the coating becomes more and more finely crystallized as the level of Si increases.

With regard to the oxidation resistance of the different coatings with addition of Si, all of the deposits underwent a step of annealing at a temperature 500° C. for two hours so as to observe the level of oxidation of the coatings in comparison with a NbN coating that underwent the same annealing.

FIG. 1 shows the grazing incidence X-ray diffractogram printout for a stainless steel substrate on which a NbN coating (dashed curve) was deposited and for a stainless steel substrate on which a Nb—Si—N coating was deposited, the Si/Nb atomic ratio being 0.27 (solid curve), both samples having undergone annealing as described previously.

On these printouts, the "a" peaks correspond to the compound NbN whereas the "b" peaks correspond to a niobium oxide.

Comparing the two curves shows that the addition of silicon considerably reduces the presence of surface oxides, the intensity of the niobium oxide peaks diminishing greatly when silicon is added to the NbN-based coating. Resistance to oxidation is thus improved.

Figures 2, 3:
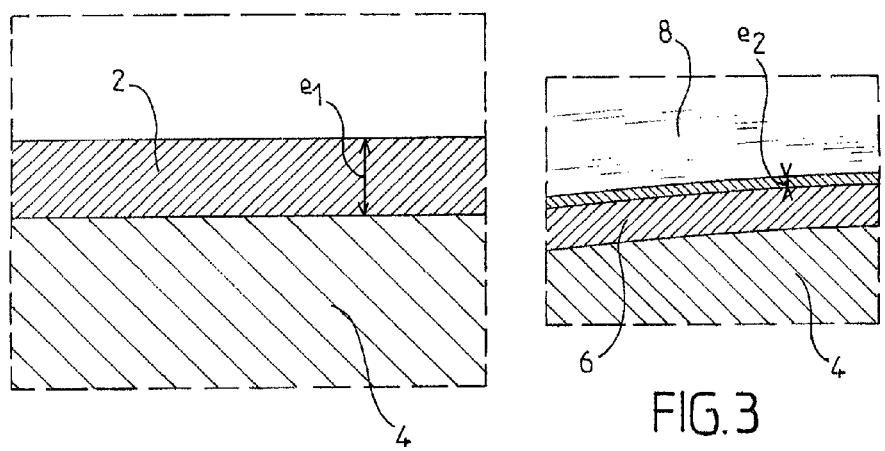
FIGS. 2 and 3 are fractographies viewed under a scanning electron microscope of two coatings, one of which is a coating according to the invention.

The scanning electron microscopy cross-sectional analysis in the secondary electron imaging mode of these two coatings NbN and Nb—Si—N after annealing shown in FIGS. 2 and 3, respectively, confirms the preceding curves. In fact, the thickness $e_1$ of oxide on the NbN coating 2 corresponds to the total thickness of the coating, the underlying compound 4 being the substrate, this oxide thickness being considerably greater than the oxide thickness $e_2$ on the Nb—Si—N coating 6, which is only superficially oxidized. The coating 6 thus forms a cooking surface 8 according to the invention. The cooking surface 8 thus consists of depositing Nb—Si—N.

Figure 4:
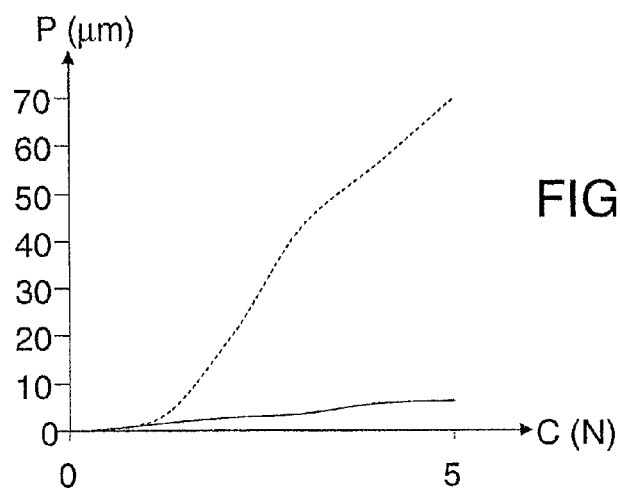
FIG. 4 shows the result of a scratch resistance test for two coatings, one of which is a coating according to the invention.

Furthermore, scratch resistance tests demonstrated that addition of silicon improves the hardness as well as the adhesion of the coating to the substrate. FIG. 4 shows the penetration depth of the diamond stylus of the apparatus in the coating relative to the load applied. The dashed curve corresponds to a NbN coating, whereas the solid curve corresponds to a Nb—Si—N coating with a Si level of 4 at. %. It is clearly evident that addition of Si makes it possible to increase the hardness considerably, even for rather low Si levels of around 1 at. %.

The information recorded by the different sensors during this test likewise confirmed an improvement of the adhesion of the film for Si contents greater than 1 at. %.

For assessing the ease in cleaning of the coatings when the latter are used as cooking surfaces, various cooking tests were conducted according to the method outlined in the applications cited previously in the Applicant's name before conducting the plynometer test.

The substrate, however, consists of three successive layers of ferritic stainless steel, aluminum, and austenitic stainless steel, all of these layers having a thickness of 0.4 mm. Prior to depositing the selected coating, a 1 μm thick layer of pure niobium is applied so as to ensure good adhesion between the substrate and the coating.

The coating is then deposited with a sufficient thickness (ca. 3 μm) before being subjected to cooking and the ease in cleaning test performed with a plynometer.

Figure 6:
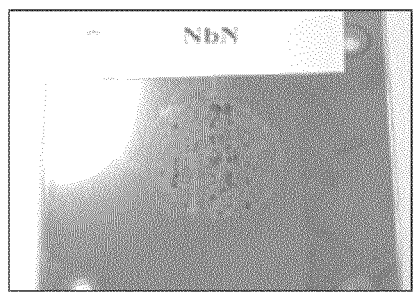
FIGS. 6 and 7 represent photographs illustrating one of the properties of the invention.
Figure 7:
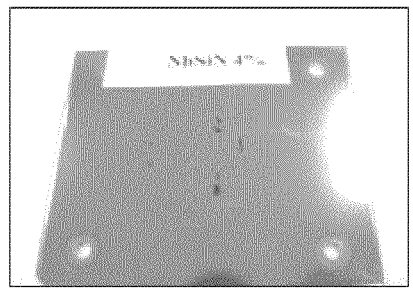

Such tests, illustrated in FIGS. 6 and 7, demonstrate in a conclusive and surprising manner that the silicon-doped NbN coatings illustrated in FIG. 7 are easier to clean than the plain NbN coatings illustrated in FIG. 6.

This aspect is all the more surprising in that it is associated with an improvement of other properties of the coating, and in particular the attenuation, even the disappearance, of oxidation stains.

Hence the addition of silicon when depositing NbN brings about the following advantages with regard to said deposit:
   increased resistance to oxidation,
   increased hardness,
   improved adhesion to the substrate,
   improved cohesion.
   greater ease in cleaning.

Moreover, the colors initially obtained by depositing NbN alone are not altered by the addition of Si.

The second example of implementation of the present invention relates to depositing a ZrN coating and the effect of addition of silicon. The cooking surface thus consists of depositing Zr—Si—N.

As with niobium, the first step consisted of determining the best conditions for depositing ZrN prior to producing Zr—Si—N compounds.

Then the same operating procedure as for Nb was carried out, wherein various tests were conducted by varying the Si content of the coating, and the features of the different coatings obtained were then assessed.

These tests also confirmed that addition of Si leads to a broadening of the X-ray diffraction peaks, thus indicating that the structure becomes more finely crystallized as the level of silicon increases.

Figure 5:
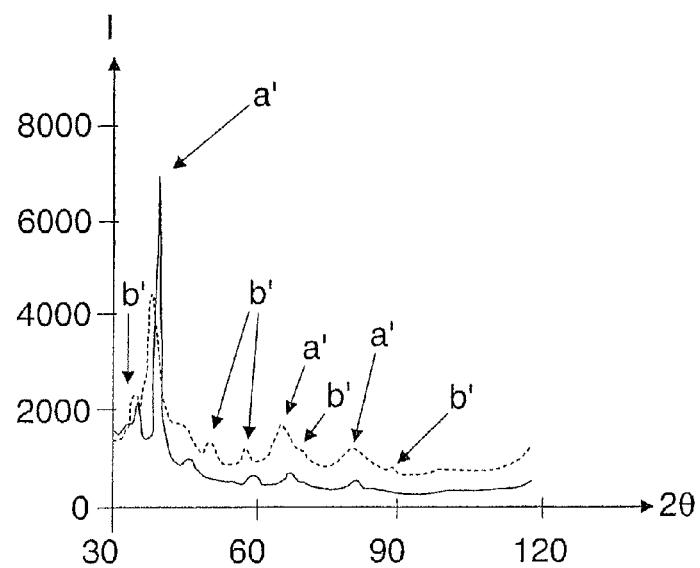
FIG. 5 is a printout similar to the one of FIG. 1, but for different coatings than the ones in FIG. 1.

Similarly to FIG. 1, FIG. 5 shows the readout of a grazing incidence X-ray diffraction for a stainless steel substrate on which was deposited a ZrN coating (dashed curve) and for a stainless steel substrate on which was deposited a Zr—Si—N coating, the Si/Zr atomic ratio being 0.04 (solid curve), which corresponds to a Si content of 2 at. % assuming that the compound ZrN is stoichiometric, these coatings having undergone a heat treatment in air heated to 500° C. for two hours prior to the measurement.

The "a'" peaks correspond to the compound ZrN, whereas the "b'" peaks correspond to the compound $ZrO_2$. As is the case for niobium, the addition of silicon improves the resistance to oxidation of the layers produced.

With regard to hardness, the addition of silicon has little effect. The ZrN coatings have good hardness properties, wherein a penetration of 9.7 μm under 5N was obtained, for example, with a hardness test using a diamond stylus. The addition of silicon led to a slight reduction of the hardness properties, wherein a penetration of 10.5 μm under 5N was obtained for the Zr—Si—N coating with 2 at. % Si, and wherein a penetration of 12.5 μm under 5N was obtained for the Zr—Si—N coating with 4 at. % Si.

The plain ZrN coating is a coating exhibiting good "ease in cleaning," with addition of silicon increasing this property slightly.

The stains, which are less pronounced on the ZrN coatings than on the NbN coatings to begin with, disappear when the coatings are doped with silicon.

The present invention is not limited to the examples of embodiment mentioned.

As an alternative option, the silicon-doped coatings could also be TiN rather than ZrN or NbN.

As an alternative option, the present invention also relates to the production of coatings that are not only zirconium nitride or niobium nitride, but based on a combination of Nb and/or Zr and/or Ti, with the aim of increasing the hardness and/or changing the color of the coating.

Furthermore, the addition of Si is also beneficial when depositing with different or supplemental reactive gases such as acetylene or methane so as to produce carbides or carbonitrides.

The present invention thus relates to a food cooking surface 8 for a culinary article or a domestic electrical cooking appliance consisting of depositing Zr and/or Nb and/or Ti on a substrate 4, the production comprising a step of carburizing and/or nitriding at least one of the elements, the surface also comprising depositing Si so as to produce (Zr/Nb/Ti)—Si—(N/C) coatings 6. Zr and/or Nb and/or Ti are advantageously deposited reactively so as to accomplish the carburizing and/or nitriding step during the deposition step. Si can be deposited in the same deposition step of depositing Zr and/or Nb and/or Ti. A metal deposition layer of one or more of the constituents Zr, Nb, or Ti can be produced prior to the carburizing and/or nitriding phase. The thickness of the deposit produced is advantageously between 2 and 10 μm.

The invention claimed is:

1. A culinary article or a domestic electrical cooking appliance having a food cooking surface, the food cooking surface including a Zr- and/or Nb- and/or Ti-based coating that is doped with Si and subjected to carburizing and/or nitriding during or after deposition of the Si and the Zr and/or Nb and/or Ti, wherein silicon content is between 1 and 15 at. %.

2. The culinary article or domestic electrical cooking appliance as in claim 1, wherein a deposit is produced by physical vapor deposition.

3. The culinary article or domestic electrical cooking appliance as in claim 2, wherein a deposition is reactive so as to accomplish the carburizing and/or nitriding step during the deposition step.

4. The culinary article or domestic electrical cooking appliance as in claim 3, wherein Si is deposited in the same deposition step of depositing Zr and/or Nb and/or Ti.

5. The culinary article or domestic electrical cooking appliance as in claim 2, wherein the deposit is produced from one or more targets obtained by assembly of one or more sheets or plates of material with a desired composition on a conductive surface, said sheets or plates being obtained by lamination, powder sintering, thermal powder spraying, or casting.

6. The culinary article or domestic electrical cooking appliance as in claim 2, wherein Si is deposited in the same deposition step of depositing Zr and/or Nb and/or Ti.

7. The culinary article or domestic electrical cooking appliance as in claim 2, wherein the food cooking surface includes a zirconium- and/or niobium-based coating that is doped with silicon and subjected to nitriding during or after deposition of the silicon and the zirconium and/or niobium.

8. The culinary article or domestic electrical cooking appliance as in claim 1, wherein Si is deposited in the same deposition step of depositing Zr and/or Nb and/or Ti.

9. The culinary article or domestic electrical cooking appliance as in claim 8, wherein the food cooking surface includes a zirconium- and/or niobium-based coating that is doped with silicon and subjected to nitriding during or after deposition of the silicon and the zirconium and/or niobium.

10. The culinary article or domestic electrical cooking appliance as in claim 1, wherein the food cooking surface includes a zirconium- and/or niobium-based coating that is doped with silicon and subjected to nitriding during or after deposition of the silicon and the zirconium and/or niobium.

11. The culinary article or domestic electrical cooking appliance as in claim 1, wherein a thickness of the deposit produced is between 2 and 10 μm.

12. The culinary article or domestic electrical cooking appliance as in claim 1, wherein the culinary article or domestic electrical cooking appliance is composed of one or more metal sheets of: aluminum, copper, cast iron, steel, and stainless steel.

13. The domestic electrical cooking appliance as in claim 1, wherein the domestic cooking appliance is electric or gas-powered.

14. The culinary article or domestic electrical cooking appliance as in claim 1, wherein Si content is between 1 and 5 at. %.

15. The culinary article as in claim 1, wherein the culinary article is a skillet, a saucepan, or a Dutch oven.

16. The domestic electrical cooking appliance as in claim 1, wherein the domestic electrical cooking appliance is a heating appliance for preparing food, a raclette grill, a fondue appliance, a fryer, a breadmaker, or a rice cooker.

17. The culinary article or domestic electrical cooking appliance as in claim 1, wherein a metal deposit layer of one or more of constituents Zr, Nb, or Ti is produced prior to carburizing and/or nitriding step.

18. The culinary article or domestic electrical cooking appliance as in claim 17, wherein a thickness of the deposit produced is between 2 and 10 μm.

* * * * *